United States Patent
Yatsenko et al.

(10) Patent No.: US 9,893,713 B2
(45) Date of Patent: Feb. 13, 2018

(54) WIDE BANDWIDTH MULIPLEXER BASED ON LC AND ACOUSTIC RESONATOR CIRCUITS FOR PERFORMING CARRIER AGGREGATION

(71) Applicant: Avago Technologies General IP (Singapore) Pte. Ltd., Singapore (SG)

(72) Inventors: Andriy Yatsenko, Munich (DE); Hongya Xu, Munich (DE); Paul Bradley, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 79 days.

(21) Appl. No.: 15/010,240

(22) Filed: Jan. 29, 2016

(65) Prior Publication Data
US 2017/0093374 A1 Mar. 30, 2017

Related U.S. Application Data

(63) Continuation-in-part of application No. 14/870,991, filed on Sep. 30, 2015.

(51) Int. Cl.
*H03H 9/70* (2006.01)
*H03H 9/72* (2006.01)
*H03H 9/54* (2006.01)
*H03H 9/64* (2006.01)
*H03H 7/01* (2006.01)

(52) U.S. Cl.
CPC .......... *H03H 9/706* (2013.01); *H03H 9/542* (2013.01); *H03H 9/6483* (2013.01); *H03H 9/725* (2013.01); *H03H 7/175* (2013.01); *H03H 7/1758* (2013.01); *H03H 7/1775* (2013.01)

(58) Field of Classification Search
CPC ...... H03H 9/542; H03H 9/6483; H03H 9/706; H03H 9/725; H03H 7/175; H03H 7/1758; H03H 7/1775
USPC .......................................................... 333/133
See application file for complete search history.

(56) References Cited

U.S. PATENT DOCUMENTS

| 5,587,620 | A | 12/1996 | Ruby et al. |
| 5,873,153 | A | 2/1999 | Ruby et al. |
| 5,910,756 | A | 6/1999 | Ella |
| 6,107,721 | A | 8/2000 | Lakin et al. |
| 6,404,279 | B2 | 6/2002 | Thomasson |
| 6,507,983 | B1 | 1/2003 | Ruby et al. |

(Continued)

FOREIGN PATENT DOCUMENTS

JP 10150342 A * 6/1998

OTHER PUBLICATIONS

Machine English translation of JP10150342A Published on Jun. 2, 1998.*

(Continued)

*Primary Examiner* — Robert Pascal
*Assistant Examiner* — Jorge Salazar, Jr.

(57) ABSTRACT

A wide bandwidth multiplexer (MUX) is provided that performs carrier aggregation. The MUX combines at least a first LC filter that acts as a low band filter, at least a first composite filter that acts as a middle band filter, and at least one other LC or composite filter that acts as a high band filter. The wide bandwidth MUX has low insertion loss and provides sufficient attenuation at adjacent edges of adjacent pass bands to prevent overlap between adjacent pass bands.

29 Claims, 11 Drawing Sheets

(56) References Cited

U.S. PATENT DOCUMENTS

| | | |
|---|---|---|
| 6,828,713 B2 | 12/2004 | Bradley et al. |
| 7,102,460 B2 | 9/2006 | Schmidhammer |
| 7,126,440 B2 | 10/2006 | Bradley et al. |
| 7,164,306 B2 * | 1/2007 | Makino .................. H03H 7/463 327/407 |
| 7,190,970 B2 * | 3/2007 | Ochii ..................... H03H 7/463 333/133 |
| 7,280,007 B2 | 10/2007 | Feng et al. |
| 7,345,410 B2 | 3/2008 | Grannen et al. |
| 7,388,454 B2 | 6/2008 | Ruby et al. |
| 7,561,009 B2 | 7/2009 | Larson et al. |
| 7,629,865 B2 | 12/2009 | Ruby et al. |
| 7,714,684 B2 | 5/2010 | Ruby et al. |
| 7,791,434 B2 | 9/2010 | Fazzio et al. |
| 7,880,566 B2 * | 2/2011 | Wada ..................... H03H 9/009 333/190 |
| 8,018,304 B2 | 9/2011 | Jian |
| 8,188,810 B2 | 5/2012 | Feng et al. |
| 8,230,562 B2 | 7/2012 | Fazzio et al. |
| 8,248,185 B2 | 8/2012 | Choy et al. |
| 9,136,819 B2 | 9/2015 | Grannen et al. |
| 2002/0180562 A1 * | 12/2002 | Taniguchi ............ H03H 9/6433 333/193 |
| 2004/0209590 A1 | 10/2004 | Forrester et al. |
| 2006/0067254 A1 | 3/2006 | Mahbub et al. |
| 2007/0205850 A1 | 9/2007 | Jamneala et al. |
| 2008/0315973 A1 | 12/2008 | Nakamura |
| 2010/0091690 A1 * | 4/2010 | Boyle .................... H04B 1/406 370/297 |
| 2010/0091752 A1 * | 4/2010 | Kemmochi ............. H03H 7/09 370/339 |
| 2011/0180391 A1 | 7/2011 | Larson et al. |
| 2011/0241798 A1 | 10/2011 | Hong |
| 2011/0266925 A1 | 11/2011 | Ruby et al. |
| 2012/0177816 A1 | 7/2012 | Larson et al. |
| 2012/0326807 A1 | 12/2012 | Choy et al. |
| 2014/0132117 A1 | 5/2014 | Larson et al. |
| 2010/0327994 A1 | 12/2014 | Choy et al. |
| 2014/0354109 A1 | 12/2014 | Grannen et al. |
| 2015/0222246 A1 | 8/2015 | Nosaka |
| 2015/0244347 A1 | 8/2015 | Feng et al. |

OTHER PUBLICATIONS

Chen, et al., "Process Variation Aware Wide Tuning Band Pass Filter for Steep Roll-Off High Rejection", Hindawi Publishing Corporation, VLSI Design, vol. 2015, Article ID 408035, 9 pages, 2015.

Office Action dated Apr. 6, 2017 in co-pending U.S. Appl. No. 14/870,991.

Dai Enguang, "SAW Filter with Insertion Loss of 2dB and Fractional Bandwidth of 30 Percent", Oct. 20, 1999, Ultrasonics Symposium, 1999 IEEE, pp. 25-28.

* cited by examiner

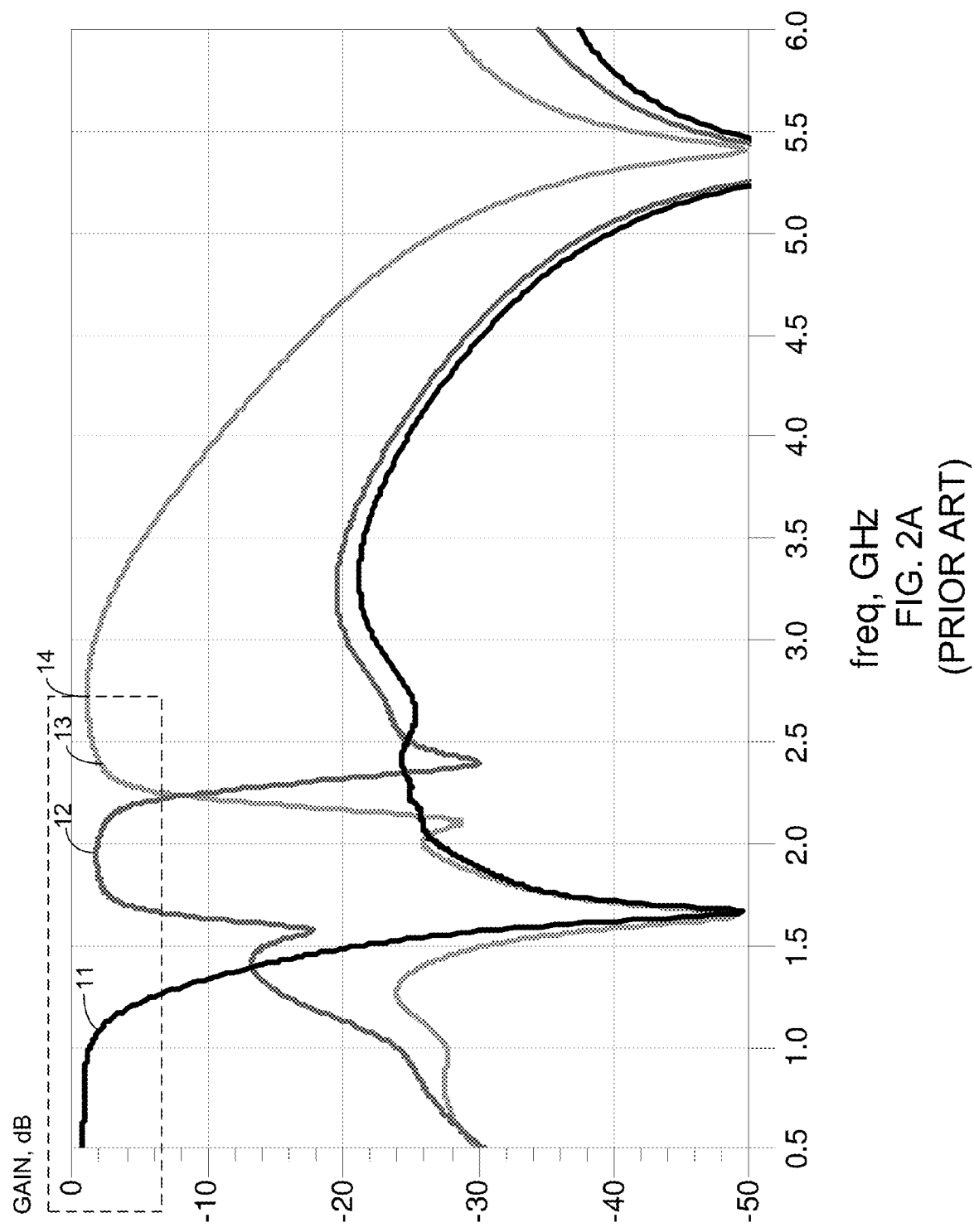

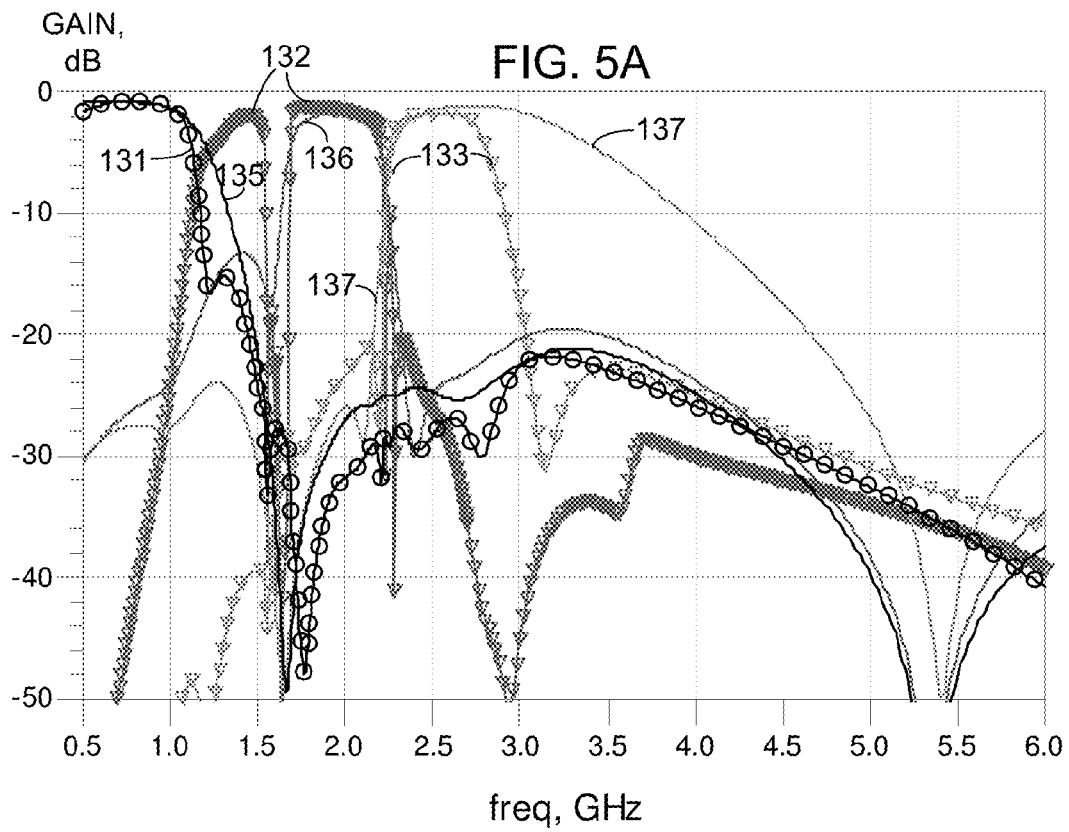
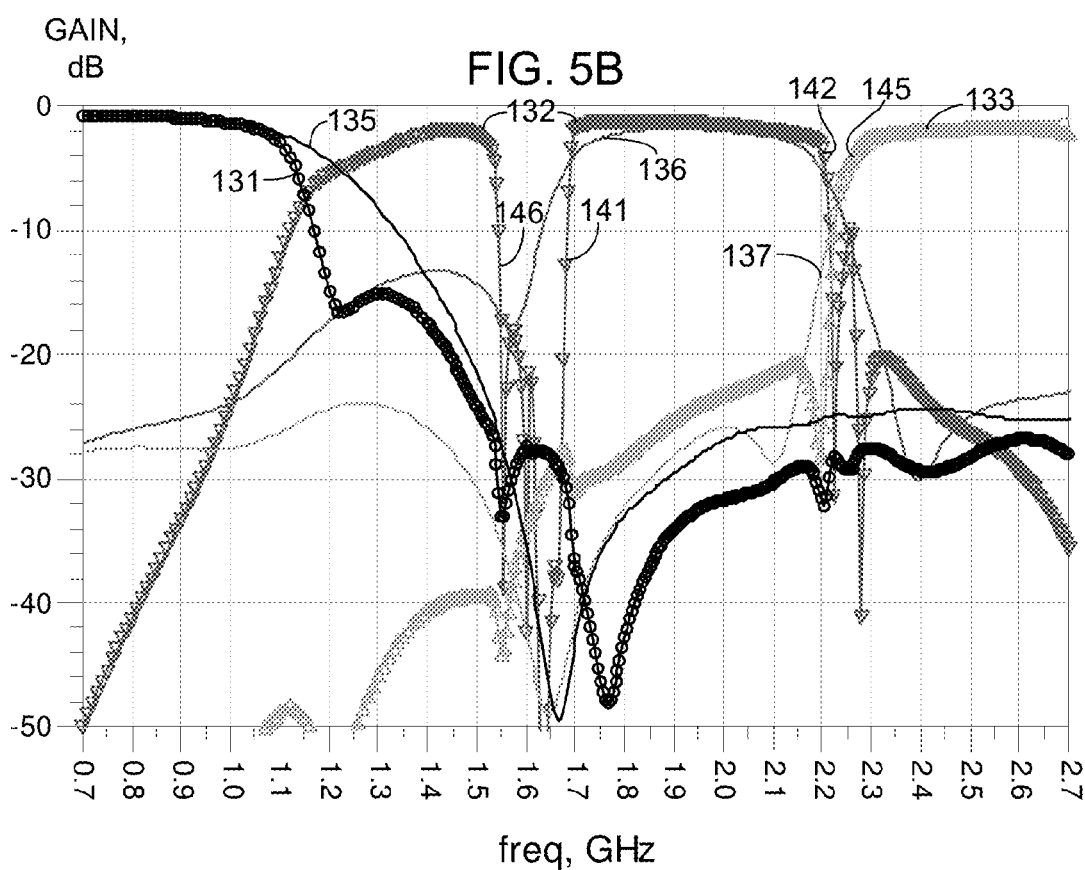

WIDE BANDWIDTH MULIPLEXER BASED ON LC AND ACOUSTIC RESONATOR CIRCUITS FOR PERFORMING CARRIER AGGREGATION

CROSS-REFERENCE TO RELATED APPLICATIONS

This application is a continuation-in-part (CIP) application of, and claims priority to and the benefit of the filing date of, U.S. application Ser. No. 14/870,991, (now U.S. Pat. No. 9,762,208) filed on Sep. 30, 2015, entitled "VERY WIDE BANDWIDTH COMPOSITE BANDPASS FILTER WITH STEEP ROLL-OFF," which is incorporated by reference herein in its entirety.

BACKGROUND

Portable communication devices, such as cellular telephones, portable computers, personal digital assistants (PDAs), and the like, are configured to communicate over wireless networks. Such portable communication devices may enable communication over multiple networks, each of which has corresponding transmit and receive frequency bands within a composite broadband frequency range. Depending on design requirements, the frequency bands may have large spectrums and/or may be separated from one another by a significant range of frequencies. For example, the composite broadband frequency range may span from about 1700 MHz to about 2170 MHz, and may include multiple frequency division duplex (FDD) frequency bands of networks over which a communication device is able to transmit and receive radio frequency (RF) signals, such as band 1 (uplink 1920-1980 megahertz (MHz); downlink 2110-2170 MHz), band 2 (uplink 1850-1910 MHz; downlink 1930-1990 MHz), band 3 (uplink 1710-1785 MHz; downlink 1805-1880 MHz), band 4 (uplink 1710-1755 MHz; downlink 2110-2155 MHz), and band 25 (uplink 1850-1915 MHz; downlink 1930-1995 MHz). High band filters may additionally support FDD LTE bands (e.g., B30 and B7) and time division duplex (TDD) bands (e.g., B40, B41).

To provide filtering of the RF signals in a composite broadband frequency range requires an ultra-wide passband for transmitting and receiving the full range of frequencies. Ultra-wide bandwidth band pass filters are therefore needed to accommodate the large passbands. An ultra-wide bandwidth may be considered any bandwidth in excess of eight percent of a center frequency $f_{center}$.

Various types of band pass filters may be used in communication devices, including LC filters reliant on inductors and capacitors, and acoustic filters reliant on acoustic resonators. The acoustic resonators may include surface acoustic wave (SAW) resonators or bulk acoustic wave (BAW) resonators, for example, where the BAW resonators may include thin film bulk acoustic resonators (FBARs) and/or solidly mounted resonators (SMRs). Generally, LC filters are able to provide very wide bandwidths. However, LC filters do not provide sufficiently steep roll-off for corresponding passbands at the very wide bandwidths, with acceptably low insertion loss for efficient operation. Roll-off is a filter characteristic indicating how quickly the transition occurs between the filter passband and the filter stop band on either side of the passband, where the steeper the roll-off, the more efficient the transition. Generally, the steepness of the roll-off increases (i.e., thus improves) using higher order filters. However, the higher the order of an LC filter, in particular, the greater the insertion loss. However, acoustic filters are not able to accommodate sufficiently wide bandwidths, e.g., due to limited intrinsic acoustic coupling, to be suitable for use as very wide bandwidth filters.

Long Term Evolution (LTE)-Advanced is mobile communication standard that includes a carrier aggregation (CA) feature. CA involves combining, or aggregating, multiple component carriers of multiple respective frequency bands to attain a greater total transmission bandwidth. Multiple filters having different pass bands may be combined in a multiplexer (MUX) of a portable communications device to perform CA. Such MUXes provide frequency division multiplexing of multiple signals having respective frequencies that fall into the respective pass bands of the respective filters. A MUX allows the signals to be simultaneously transmitted (uplink) from the portable communications device over the respective frequencies of the respective pass bands. The MUX also performs demultiplexing to separate signals having the respective frequencies that are received (downlink) by the portable communications device.

FIG. 1 illustrates a schematic diagram of a typical MUX 2 made up of three LC filters 3, 4 and 5, each of which is made up of a particular configuration of inductors 6 and capacitors 7 that achieves a respective pass band. All of the LC filters 3, 4 and 5 are connected to an antenna 8 of the portable communications device (not shown). In this example, LC filter 3 provides a low pass band ranging from 700 to 960 MHz, LC filter 4 provides a middle pass band ranging from 1710 to 2170 MHz, and LC filter 5 provides a high pass band ranging from 2300 to 2690 MHz. The frequency gap between the upper edge of the middle pass band (2170 MHz) and the lower edge of the high pass band (2300 MHz) is only 130 MHz. Due to this small frequency gap, adjacent frequency bands in the middle and high pass bands should be sufficiently attenuated to prevent the adjacent bands from overlapping. This requirement, however, is difficult to achieve with acceptable insertion loss using LC filters of the type shown in FIG. 1, as will now be explained with reference to FIGS. 2A and 2B.

FIG. 2A is a graph containing first, second and third frequency response plots 11, 12 and 13 for the LC filters 3, 4 and 5, respectively, shown in FIG. 1. FIG. 2B is an enlarged view of the portion of the graph contained within the dashed block 14 shown in FIG. 2A. With reference to FIG. 2B, it can be seen that signal loss at the upper edge at 2170 MHz (reference numeral 15) of the middle pass band (plot 12) is around 4 decibels (dB), and that signal loss at the lower edge of the high pass band (plot 13) at 2300 MHz (reference numeral 16) is around 4 dB. This amount of attenuation at these adjacent edges of the middle and high pass bands is insufficient to ensure that overlap between the pass bands is avoided. Furthermore, if there is an additional rejection requirement, such as where an LC filter is included that provides a GPS/GNSS/Beidou pass band (1560 to 1606 MHz), then there is only a 104 MHz frequency gap between the lower edge of the middle pass band and the upper edge of the GPS/GNSS/Beidou pass band (not shown). It can be seen in FIG. 2B that the lower edge of the middle pass band at 1710 MHz (reference numeral 17) is around 4 dB, which is an insufficient amount of attenuation at the adjacent edges of these bands to prevent overlap.

In addition, the MUX 2 shown in FIG. 1 exhibits a relatively high insertion loss in the middle and high pass bands. Because the MUX 2 is typically placed directly at the antenna 8, it generally is unsuitable for use in today's portable communications devices because its high insertion loss would lead to very poor system efficiency.

A need exists for an ultra-wide bandwidth MUX for use in a portable communications device that has low insertion loss and that provides sufficient attenuation at adjacent edges of adjacent pass bands.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2A is a graph containing first, second and third frequency response plots for the LC filters shown in FIG. 1.

FIG. 5A is a graph showing the frequency response plots shown in FIG. 5A for frequencies ranging from 500 MHz on the low end to 6,000 MHz on the high end.

FIG. 5B is a zoomed-in view of the graph shown in FIG. 5A containing frequency response plots for the filters shown in FIG. 4 for frequencies ranging from 700 MHz on the low end to 2,700 MHz on the high end.

DETAILED DESCRIPTION

Figure 1:
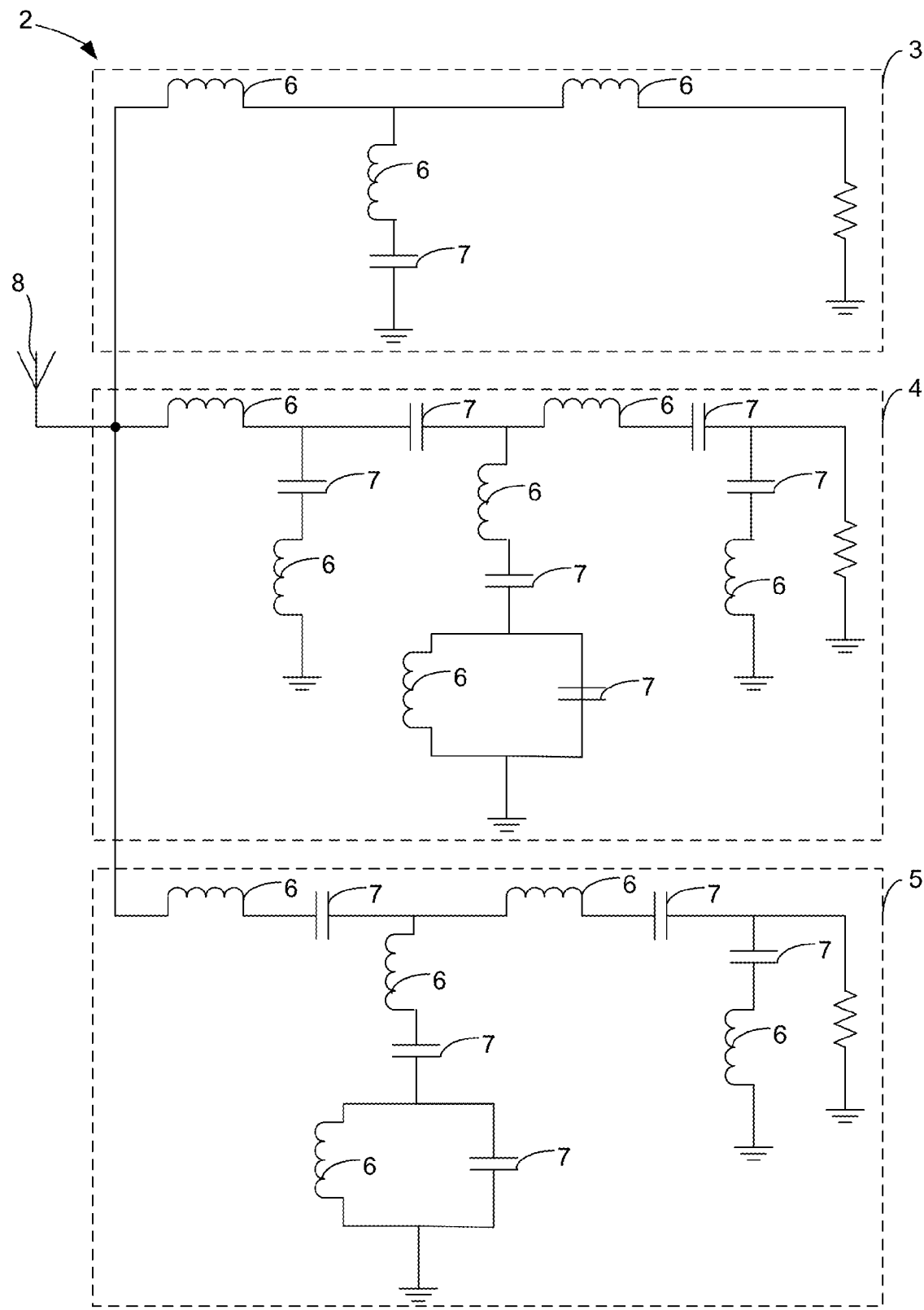
FIG. 1 is a schematic diagram of a typical MUX made up of three LC filters, each of which is made up of a particular configuration of inductors and capacitors that achieves a respective pass band.
Figure 2B:
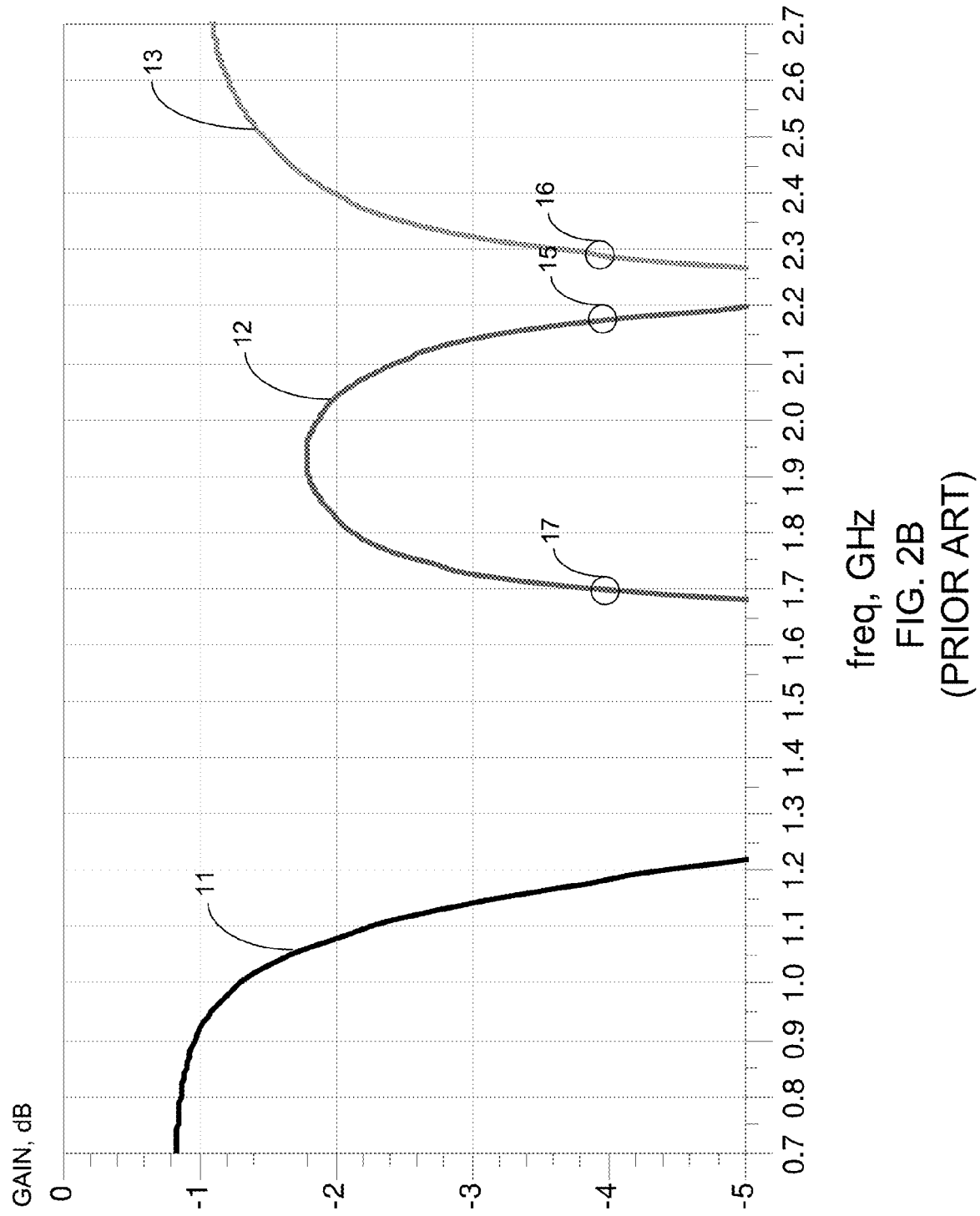
FIG. 2B is an enlarged view of the portion of the graph contained within the dashed block 14 shown in FIG. 2A.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Unless otherwise noted, when a device is said to be connected to another device, this encompasses cases where one or more intermediate devices may be employed to connect the two devices to each other. However, when a device is said to be directly connected to another device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Generally, according to various embodiments, an ultra-wide bandwidth MUX is provided that performs CA by combining at least a first LC filter that acts as a low band filter, at least a first composite filter that acts as a middle band filter, and at least one other LC or composite filter that acts as a high band filter. A "composite filter," as that term is used herein, denotes a filter that includes at least one acoustic resonator device and at least one inductor, although it may also include one or more capacitors and one or more resistors.

The term "band," as that term is used herein, is intended to denote a range of frequencies that a filter passes. For example, a low band filter, as that term is used herein, is a filter that passes a range of frequencies that are lower than a range of frequencies passed by a middle or high band filter, and a high band filter is a filter that passes a range of frequencies that are higher than a range of frequencies passed by the middle and low band filters. The low band filter can be implemented using lowpass or bandpass filter topologies. The middle band filter can be implemented using a bandpass filter topology. The high band filter can be implemented using bandpass or highpass filter topologies.

An "ultra-wide bandwidth," as that term is used herein, is a bandwidth in excess of eight percent of a center frequency $f_{center}$. An "ultra wide bandwidth MUX," as that term is used herein, is a MUX having at least a low band filter, a middle band filter and a high band filter and that performs multiplexing and demultiplexing operations where the lowest frequency and the highest frequency passed by the low and high band filters, respectively, are at least eight percent less than and eight percent greater than, respectively, the center frequency $f_{center}$ of the middle band filter.

The ultra-wide bandwidth MUX described herein has low insertion loss and provides sufficient attenuation, or roll-off, at adjacent edges of adjacent bands to prevent the adjacent bands from overlapping one another. Representative, or exemplary, embodiments of the MUX will now be described with reference to FIGS. 3-10, in which like reference numerals represent like elements, features or components. It should be noted that elements, features or components shown in the figures are not necessarily drawn to scale, emphasis instead being placed on describing principles and concepts of the various embodiments.

Figure 3:
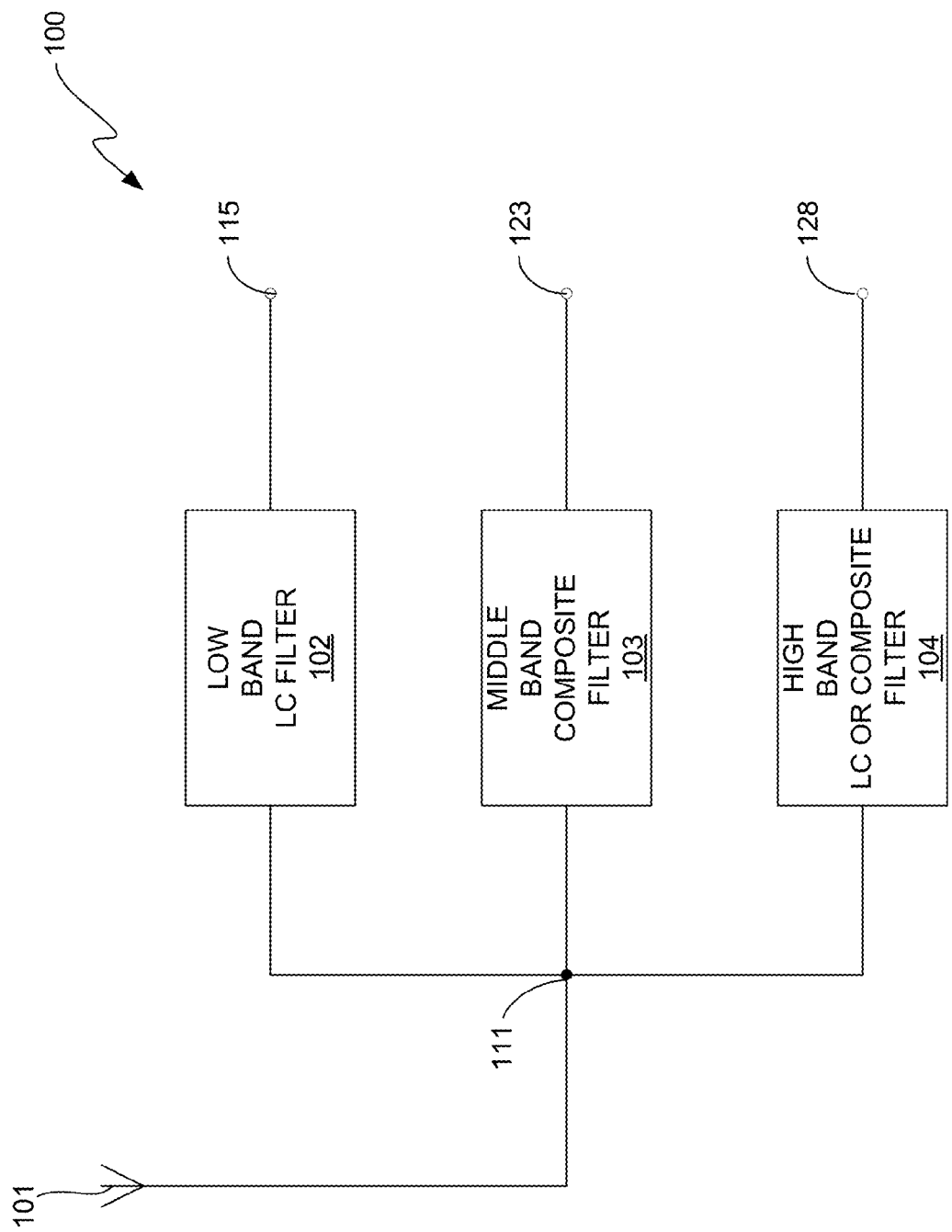
FIG. 3 is a block diagram of an ultra-wide bandwidth MUX in accordance with a representative embodiment.

FIG. 3 is a block diagram of an ultra-wide bandwidth MUX 100 in accordance with a representative embodiment. The MUX 100 comprises an antenna 101, a low band LC filter 102, a middle band composite filter 103, and a high band LC or composite filter 104. The filters 102, 103 and 104 are connected to the antenna 101 via an input terminal 111 of the MUX 100. In the uplink direction, electrical signals having frequencies that are within the respective frequency ranges, or bands, of the filters 102-104 are input to the MUX 100 at input/output (I/O) terminals 115, 123 and 128, respectively, and simultaneously transmitted as electromagnetic waves by antenna 101 over the air. In the downlink direction, electromagnetic waves of the respective frequencies are received by the antenna 101, provided to the filters 102-104, and filtered by the respective filters 102-104 to perform frequency division demultiplexing. The respective electrical signals having the respective frequencies are output from the MUX 100 via the respective terminals 115, 123 and 128.

In accordance with a representative embodiment, and just by way of example, the low band LC filter 102 passes electrical signals having frequencies in the range of approximately 0 GHz to approximately 960 MHz; the middle band composite filter 103 is configured to pass signals having frequencies in the range of approximately 1710 MHz to approximately 2170 MHz; and the high band LC or composite filter 104 is configured to pass signals having frequencies in the range of approximately 2300 MHz to approximately 2690 MHz. In accordance with another representative embodiment discussed below in more detail, the middle band composite filter 103 may be configured as a dual band filter that also passes frequencies ranging from approximately 1427.9 MHz to approximately 1511 MHz. It should be noted, however, that these frequency ranges are merely illustrative and are not intended to be restrictive of the present teachings. The MUX 100, in accordance with this illustrative embodiment, is configured to perform CA in accordance with the current LTE-Advanced standard, and the frequency bands given above are currently the major LTE bands covered by the standard.

Figure 4:
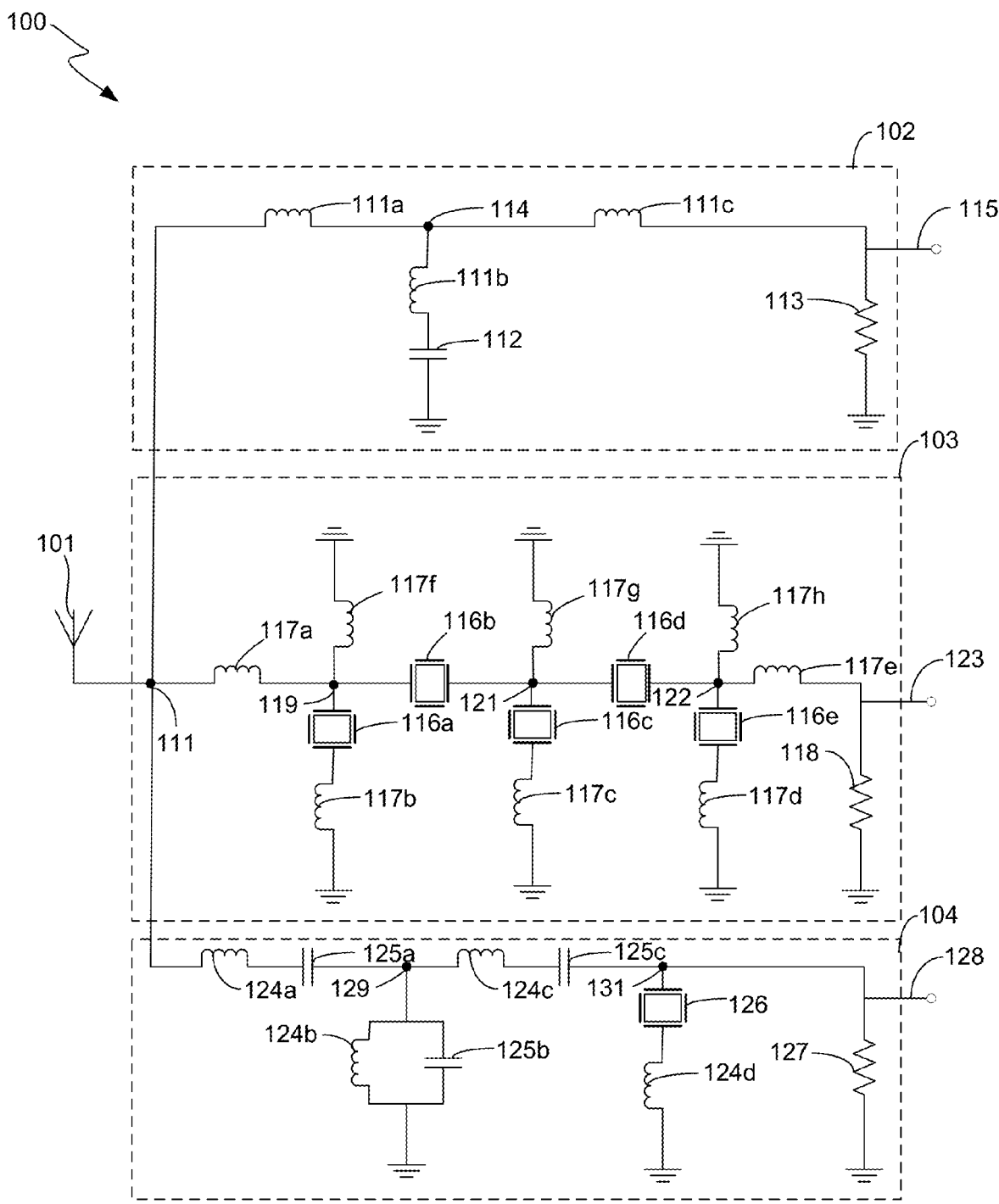
FIG. 4 illustrates a schematic diagram of the MUX shown in FIG. 3 in accordance with a representative embodiment.

FIG. 4 illustrates a schematic diagram of the MUX 100 shown in FIG. 3 in accordance with a representative embodiment. The low band (lowpass) filter 102 has the same configuration of inductors 111a-111c, a capacitor 112 and a load resistor 113 as the LC filter 3 shown in FIG. 1. A first inductor 111a has a first terminal connected to the antenna 101 and a second terminal connected to a circuit node 114. A second inductor 111b has a first terminal connected to circuit node 114 and a second terminal connected to a first terminal of the capacitor 112. A second terminal of the capacitor 112 is connected to electrical ground. A third inductor 111c has a first terminal connected to circuit node 114 and a second terminal connected to a first terminal of the load resistor 113. A second terminal of the load resistor 113 is connected to electrical ground. The first terminal of the load resistor 113 is connected to the first I/O terminal 115 of the MUX 100.

In the uplink direction, the first I/O terminal 115 acts as an input terminal of the MUX 100 in that it receives an electrical input signal from transmitter circuitry (not shown) of the portable communications device. In the downlink direction, the first I/O terminal 115 acts as an output terminal of the MUX 100 in that it outputs a filtered electrical output signal to receiver circuitry (not shown) of the portable communications device.

The middle band filter 103 is a composite (bandpass) filter that comprises a plurality of acoustic resonator devices 116a-116e, a plurality of inductors 117a-117h and a load resistor 118. The acoustic resonator devices 116a-116e are typically High-Q BAW resonator devices. A first inductor 117a has a first terminal connected to the antenna 101 and a second terminal connected to a circuit node 119. A first acoustic resonator device 116a has a first terminal connected to circuit node 119 and a second terminal connected to a first terminal of a second inductor 117b. A second terminal of the second inductor 117b is connected to electrical ground. A first terminal of a second acoustic resonator device 116b is connected to node 119 and a second terminal of the second acoustic resonator device 116b is connected to circuit node 121. A first terminal of a third acoustic resonator device 116c is connected to node 121 and a second terminal of the third acoustic resonator device 116c is connected to a first terminal of a third inductor 117c. A second terminal of the third inductor 117c is connected to electrical ground.

A first terminal of a fourth acoustic resonator device 116d is connected to node 121 and a second terminal of the fourth acoustic resonator device 116d is connected to circuit node 122. A first terminal of a fifth acoustic resonator device 116e is connected to circuit node 122 and a second terminal of the fifth acoustic resonator device 116e is connected to a first terminal of a fourth inductor 117d. A second terminal of the fourth inductor 117d is connected to electrical ground. A first terminal of a fifth inductor 117e is connected to circuit node 122 and a second terminal of the fifth indictor 117e is connected to a first terminal of a load resistor 118. A second terminal of the load resistor 118 is connected to electrical ground. The first terminal of the load resistor 118 is connected to the second I/O terminal 123 of the MUX 100.

A first terminal of a sixth inductor 117f is connected to circuit node 119 and a second terminal of the sixth inductor 117f is connected to electrical ground. A first terminal of a seventh inductor 117g is connected to circuit node 121 and a second terminal of the seventh inductor 117g is connected to electrical ground. A first terminal of an eighth inductor 117h is connected to circuit node 122 and a second terminal of the eighth inductor 117h is connected to electrical ground.

The shunt inductors 117f-117h shift the series resonant frequencies, fs, of the acoustic resonator devices 116a,116c and 116e to provide the acoustic resonator devices 116a, 116c and 116e with much wider bandwidths than they would otherwise have, thereby extending the bandwidth of the middle band filter 103. In addition, the inclusion of the shunt inductors 117f-117h enables the middle band filter 103 to provide dual pass bands, as will be described below in more detail with reference to FIGS. 5A and 5B.

In the uplink direction, the second I/O terminal 123 acts as an input terminal of the MUX 100 in that it receives an electrical input signal from transmitter circuitry (not shown) of the portable communications device. In the downlink direction, the second I/O terminal 123 acts as an output terminal of the MUX 100 in that it outputs a filtered electrical output signal to receiver circuitry (not shown) of the portable communications device.

The high band (bandpass) filter 104, in accordance with this representative embodiment, is a composite filter comprising a plurality of inductors 124a-124d, a plurality of capacitors 125a-125c, an acoustic resonator device 126, a load resistor 127, and the third I/O terminal 128.

A first inductor 124a has a first terminal connected to the antenna 101 and a second terminal connected a first terminal of a first capacitor 125a. A second terminal of the first capacitor 125a is connected to a circuit node 129. A first terminal of a second inductor 124b is connected to circuit node 129 and a second terminal of the second inductor 124b is connected to electrical ground. A first terminal of a second capacitor 125b is connected to node 129 and a second terminal of the second capacitor 125b is connected to electrical ground. A first terminal of a third inductor 124c is connected to node 129 and a second terminal of the third inductor 124c is connected to a first terminal of a third capacitor 125c. A second terminal of the third capacitor 125c is connected to circuit node 131.

A first terminal of the acoustic resonator device 126 is connected to circuit node 131 and a second terminal of the acoustic resonator device 126 is connected to a first terminal of a fourth inductor 124d. This acoustic resonator device 126 improves the steepness of the high band filter 104. A second terminal of the fourth inductor 124d is connected to electrical ground. A first terminal of a load resistor 127 is connected to circuit node 131 and a second terminal of the load resistor 127 is connected to electrical ground. The first terminal of the load resistor 127 is connected to a third I/O terminal 128 of the MUX 100.

In the uplink direction, the third I/O terminal 128 acts as an input terminal of the MUX 100 in that it receives an electrical input signal from transmitter circuitry (not shown) of the portable communications device. In the downlink direction, the third I/O terminal 128 acts as an output terminal of the MUX 100 in that it outputs a filtered electrical output signal to receiver circuitry (not shown) of the portable communications device.

As indicated above, generally, the low band filter 102 comprises an LC filter, the middle band filter 103 comprises a composite filter, and the high band filter 104 comprises an LC or composite filter. These filters, however, can be achieved using a variety of circuit configurations, as will be understood by those of skill in the art in view of the teachings provided herein. Additional examples of various circuit configurations for these filters are described below with reference to FIGS. 8-10.

FIG. 5A is a graph containing first, second and third frequency response plots 131, 132 and 133 for the filters 102, 103 and 104, respectively, shown in FIG. 4 for frequencies ranging from 500 MHz on the low end to 6,000 MHz on the high end. FIG. 5B is a zoomed-in view of the graph shown in FIG. 5A showing the first, second and third frequency response plots 131, 132 and 133 shown in FIG. 4 for frequencies ranging from 700 MHz on the low end to 2,700 MHz on the high end. The plots represented by reference numerals 135, 136 and 137 are the frequency responses for the LC filters 3, 4 and 5, respectively, of the known MUX 2 shown in FIG. 1.

In accordance with this embodiment, the middle band composite filter 103 is configured as a dual band filter that has a first pass band that passes electrical signals having frequencies ranging from approximately 1427.9 MHz to approximately 1511 MHz and a second pass band that passes electrical signals having frequencies ranging from approximately 1710 MHz to approximately 2170 MHz. In accordance with this representative embodiment, the low band LC filter 102 passes electrical signals having frequencies ranging from approximately 0 GHz to approximately 960 MHz, and the high band filter 104 passes electrical signals having frequencies ranging from approximately 2300 MHz to approximately 2690 MHz.

It can be seen from FIG. 5B that the frequency response plot 132 corresponding to the middle band filter 103 has a steeper roll-off at the lower-frequency edge 141 and higher-frequency edge 142 of plot 132 than the plot 136 corresponding to the middle band filter 4 shown in FIG. 1. The improvement in roll-off ensures that there will not be overlap between the higher-frequency edge 142 of plot 132 and the lower-frequency edge 145 of the plot 133, which corresponds to the frequency response of the high band filter 104. The improvement in roll-off also ensures that there will not be overlap between the higher-frequency edge 146 of plot 132 corresponding to the first pass band of the middle band filter 103 and the lower-frequency edge 141 of plot 132 corresponding to the second pass band of the middle band filter 103.

Figure 6:
FIG. 6 is an enlarged portion of plots shown in FIGS. 5A and 5B for frequencies ranging from 1700 MHz to 2200 MHz and gain ranging from 0 to −5 dB.

FIG. 6 is an enlarged portion of plots 132 and 136 shown in FIGS. 5A and 5B for frequencies ranging from 1700 MHz to 2200 MHz and gain ranging from 0 to −5 dB. As indicated above, plot 132 is the frequency response plot for the second pass band of the middle band filter 104 shown in FIG. 4 and plot 136 is the frequency response plot for the middle band filter 4 shown in FIG. 1. The insertion loss of the MUX 100 at the lower-frequency edge 141 of plot 132 is approximately 2.5 dB less than the insertion loss of the MUX 2 shown in FIG. 1 at the same frequency. The insertion loss of the MUX 100 at the higher-frequency edge 142 of plot 132 is approximately 1.0 dB less than the insertion loss of the MUX 2 shown in FIG. 1 at the same frequency. Thus, there is a significant improvement in insertion loss for the middle band.

Figure 7:
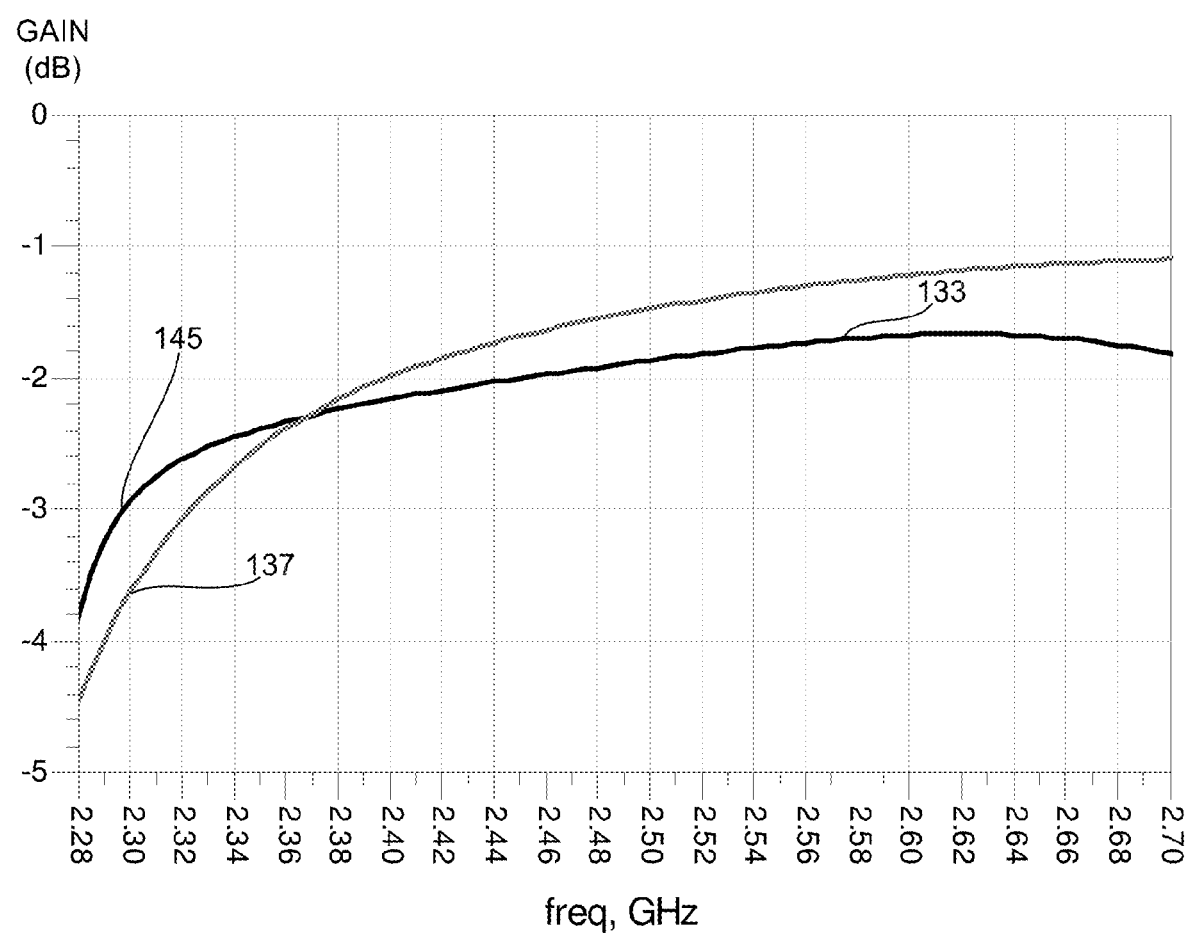
FIG. 7 is an enlarged portion of plots shown in FIGS. 5A and 5B for frequencies ranging from 2280 MHz to 2700 MHz and gain ranging from 0 to −5 dB.

FIG. 7 is an enlarged portion of plots 133 and 137 shown in FIGS. 5A and 5B for frequencies ranging from 2280 MHz to 2700 MHz and gain ranging from 0 to −5 dB. As indicated above, plot 133 is the frequency response plot for the high band filter 104 shown in FIG. 4 and plot 137 is the frequency response plot for the high band filter 5 shown in FIG. 1. The insertion loss of the MUX 100 at the lower-frequency edge 145 of plot 133 is approximately 1.0 dB less than the insertion loss of the MUX 2 shown in FIG. 1 at the same frequency. Thus, there is a significant improvement in insertion loss for the high band.

It can also be seen from FIGS. 5A-7 that no bandwidth is sacrificed to achieve the improvements in insertion loss and roll-off. In other words, the filters 102-104 are able to provide the same wide pass bands as the filters 3-5, respectively, shown in FIG. 1, but with improvements in insertion loss and roll-off.

Figure 8:
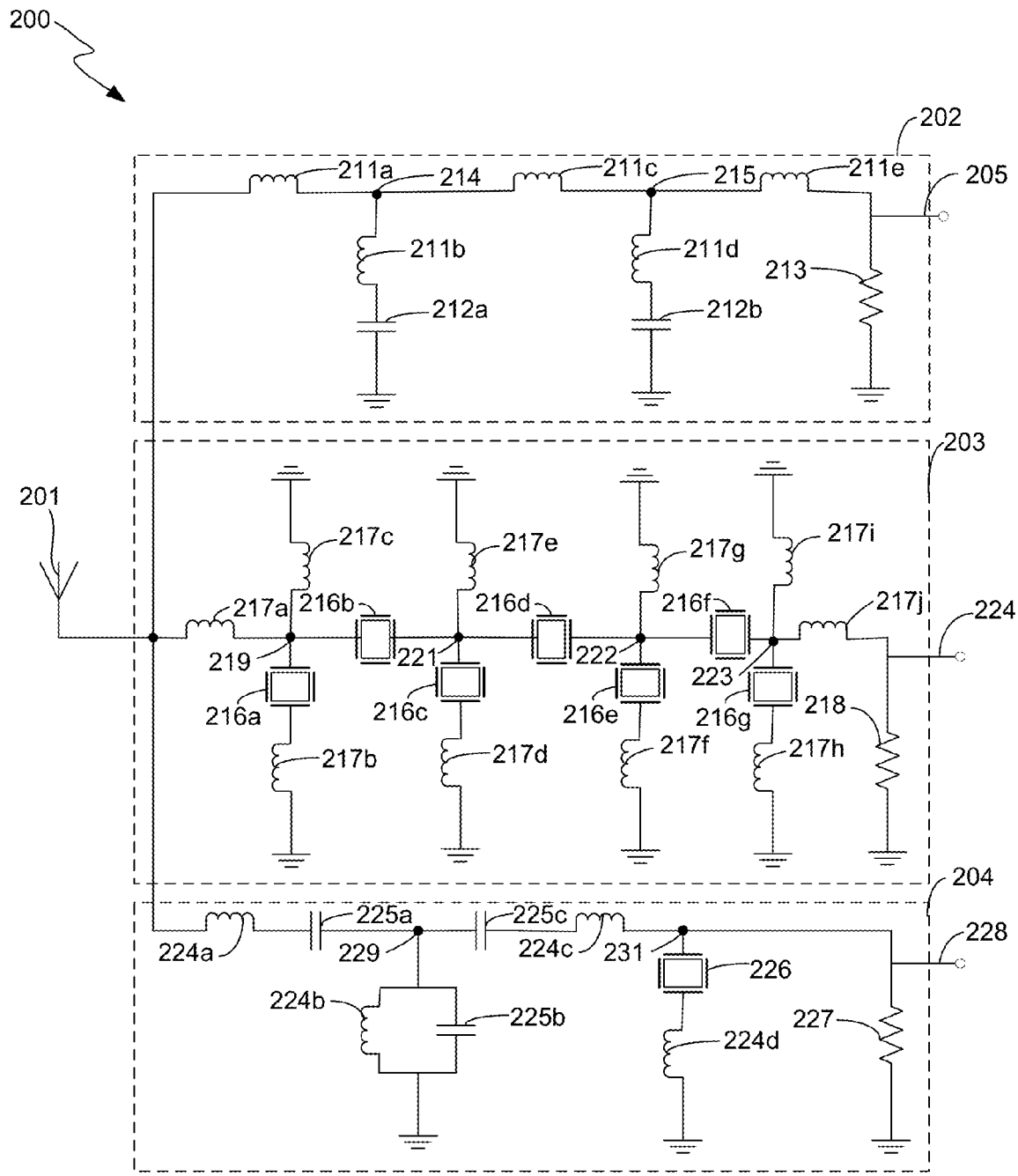
FIG. 8 illustrates a schematic diagram of the ultra-wide bandwidth MUX in accordance with another representative embodiment comprising an antenna, a low pass band LC filter, a middle pass band composite filter, and a high pass band composite filter.

FIG. 8 illustrates a schematic diagram of the ultra-wide bandwidth MUX 200 in accordance with another representative embodiment comprising an antenna 201, a low band LC filter 202, a middle band composite filter 203, and a high band composite filter 204. Each of the filters 202, 203 and 204 has a respective I/O terminal 205, 224 and 228. The low and middle band filters 202 and 203 have higher orders than the low and middle band filters 102 and 103, respectively, shown in FIG. 4.

The low band filter 202 has inductors 211a-211e, capacitors 212a-212b and a load resistor 213. A first inductor 211a has a first terminal connected to the antenna 201 and a second terminal connected to a circuit node 214. A second inductor 211b has a first terminal connected to circuit node 214 and a second terminal connected to a first terminal of a first capacitor 212a. A second terminal of the first capacitor 212a is connected to electrical ground. A third inductor 211c has a first terminal connected to circuit node 214 and a second terminal connected to a circuit node 215. A fourth inductor 211d has a first terminal connected to circuit node 215 and a second terminal connected to a first terminal of a second capacitor 212b. A second terminal of the second capacitor 212b is connected to electrical ground. A fifth inductor 211e has a first terminal that is connected to the circuit node 215 and a second terminal that is connected to a first terminal of the load resistor 213. A second terminal of the load resistor 213 is connected to electrical ground. The first terminal of the load resistor 213 is connected to the first I/O terminal 205 of the MUX 200.

The middle band filter 203 comprises a plurality of acoustic resonator devices 216a-216g, a plurality of inductors 217a-217j and a load resistor 218. The shunt inductors 217c, 217e, 217g and 217i provide the same advantages described above with reference to FIG. 4 of extending the bandwidth of the middle band filter and of enabling it to provide dual pass bands. The acoustic resonator devices 216a-216g are typically High-Q BAW resonator devices. A first inductor 217a has a first terminal connected to the antenna 201 and a second terminal connected to a circuit node 219. A first acoustic resonator device 216a has a first terminal connected to circuit node 219 and a second terminal connected to a first terminal of a second inductor 217b. A second terminal of the second inductor 217b is connected to electrical ground. A first terminal of a third inductor 217c is connected to circuit node 219 and a second terminal of the third inductor 217c is connected to electrical ground.

A first terminal of a second acoustic resonator device 216b is connected to circuit node 219 and a second terminal of the second acoustic resonator device 216b is connected to circuit node 221. A first terminal of a third acoustic resonator device 216c is connected to node 221 and a second terminal of the third acoustic resonator device 216c is connected to a first terminal of a fourth inductor 217d. A second terminal of the fourth inductor 217d is connected to electrical ground. A first terminal of a fifth inductor 217e is connected to circuit node 221 and a second terminal of the fifth inductor 217e is connected to electrical ground.

A first terminal of a fourth acoustic resonator device 216d is connected to circuit node 221 and a second terminal of the fourth acoustic resonator device 216d is connected to circuit node 222. A first terminal of a fifth acoustic resonator device 216e is connected to circuit node 222 and a second terminal of the fifth acoustic resonator device 216e is connected to a first terminal of a sixth inductor 217f. A second terminal of the sixth inductor 217f is connected to electrical ground. A first terminal of a seventh inductor 217g is connected to circuit node 222 and a second terminal of the seventh indictor 217g is connected to electrical ground. A first terminal of a sixth acoustic resonator device 216f is connected to circuit node 222 and a second terminal of the sixth acoustic resonator device is connected to a circuit node 223.

A first terminal of a seventh acoustic resonator device 216g is connected to circuit node 223 and a second terminal of the seventh acoustic resonator device 216g is connected to a first terminal of an eighth inductor 217h. A first terminal of a ninth inductor 217i is connected to circuit node 223 and a second terminal of the ninth inductor 217i is connected to electrical ground. A first terminal of a tenth inductor 217j is connected to circuit node 223 and a second terminal of the tenth indictor 217j is connected to a first terminal of a load resistor 218. A second terminal of the load resistor 218 is connected to electrical ground. The first terminal of the load resistor 218 is connected to the second I/O terminal 224 of the MUX 200.

The high band filter 204, in accordance with this representative embodiment, is a composite LC/acoustic filter comprising a plurality of inductors 224a-224d, a plurality of capacitors 225a-225c, an acoustic resonator device 226, a load resistor 227, and a third I/O terminal 228. A first inductor 224a has a first terminal connected to the antenna 201 and a second terminal connected a first terminal of a first capacitor 225a. A second terminal of the first capacitor 225a is connected to a circuit node 229. A first terminal of a second inductor 224b is connected to circuit node 229 and a second terminal of the second inductor 224b is connected to electrical ground. A first terminal of a second capacitor 225b is connected to circuit node 229 and a second terminal of the second capacitor 225b is connected to electrical ground. A first terminal of a third capacitor 225c is connected to circuit node 229 and a second terminal of the third capacitor 225c is connected to a first terminal of a third inductor 224c. A second terminal of the third inductor 224c is connected to a circuit node 231.

A first terminal of the acoustic resonator device 226 is connected to circuit node 231 and a second terminal of the acoustic resonator device 226 is connected to a first terminal of a fourth inductor 224d. A second terminal of the fourth inductor 224d is connected to electrical ground. A first terminal of the load resistor 227 is connected to circuit node 231 and a second terminal of the load resistor 227 is connected to electrical ground. The first terminal of the load resistor 227 is connected to the third I/O terminal 228 of the MUX 200.

Figure 9:
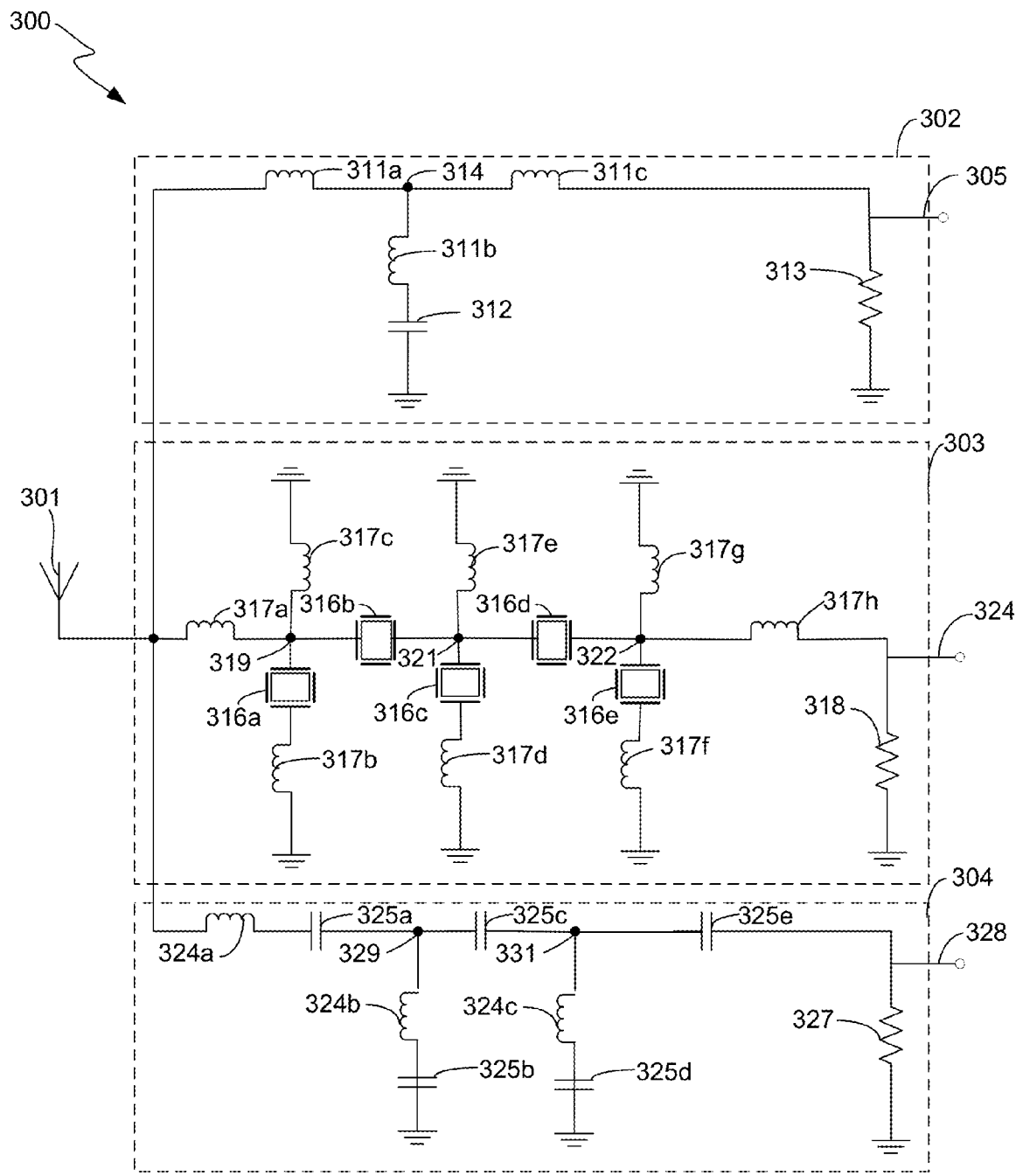
FIG. 9 illustrates a schematic diagram of the ultra-wide bandwidth MUX in accordance with another representative embodiment comprising an antenna, a low pass band LC filter, a middle pass band composite filter, and a high pass band LC filter.

FIG. 9 illustrates a schematic diagram of the ultra-wide bandwidth MUX 300 in accordance with another representative embodiment comprising an antenna 301, a low band LC filter 302, a middle band composite filter 303, and a high band LC filter 404. Each of the filters 302, 303 and 304 has an I/O terminal 305, 324 and 328, respectively. The high band LC filter 404 is a highpass filter, whereas the high band composite filter 104 shown in FIG. 4 is a bandpass filter.

The low band filter 302 has inductors 311a-311c, a capacitor 312 and a load resistor 313. A first inductor 311a has a first terminal connected to the antenna 301 and a second terminal connected to a circuit node 314. A second inductor 311b has a first terminal connected to circuit node 314 and a second terminal connected to a first terminal of the capacitor 312. A second terminal of the capacitor 312 is connected to electrical ground. A third inductor 311c has a first terminal connected to circuit node 314 and a second terminal connected to a first terminal of the load resistor 313. A second terminal of the load resistor 313 is connected to electrical ground. The first terminal of the load resistor 313 is connected to the first I/O terminal 305 of the MUX 300.

The middle band filter 303 comprises a plurality of acoustic resonator devices 316a-316e, a plurality of inductors 317a-317h and a load resistor 318. The shunt inductors 317c, 317e, and 317g provide the same advantages described above of extending the bandwidth of the middle band filter and of enabling it to provide dual pass bands. The acoustic resonator devices 316a-316e are typically High-Q BAW resonator devices. A first inductor 317a has a first terminal connected to the antenna 301 and a second terminal connected to a circuit node 319. A first acoustic resonator device 316a has a first terminal connected to circuit node 319 and a second terminal connected to a first terminal of a second inductor 317b. A second terminal of the second inductor 317b is connected to electrical ground. A first terminal of a third inductor 317c is connected to circuit node 319 and a second terminal of the third inductor 317c is connected to electrical ground.

A first terminal of a second acoustic resonator device 316b is connected to circuit node 319 and a second terminal of the second acoustic resonator device 316b is connected to circuit node 321. A first terminal of a third acoustic resonator device 316c is connected to node 321 and a second terminal of the third acoustic resonator device 316c is connected to a first terminal of a fourth inductor 317d. A second terminal of the fourth inductor 317d is connected to electrical ground. A first terminal of a fifth inductor 317e is connected to circuit node 321 and a second terminal of the fifth inductor 317e is connected to electrical ground.

A first terminal of a fourth acoustic resonator device 316d is connected to circuit node 321 and a second terminal of the fourth acoustic resonator device 316d is connected to circuit node 322. A first terminal of a fifth acoustic resonator device 316e is connected to circuit node 322 and a second terminal of the fifth acoustic resonator device 316e is connected to a first terminal of a sixth inductor 317f. A second terminal of the sixth inductor 317f is connected to electrical ground. A first terminal of a seventh inductor 317g is connected to circuit node 322 and a second terminal of the seventh indictor 317g is connected to electrical ground. A first terminal of a eighth inductor 317h is connected to circuit node 322 and a second terminal of the eighth indictor 317h is connected to a first terminal of a load resistor 318. A second terminal of the load resistor 318 is connected to electrical ground. The first terminal of the load resistor 318 is connected to the second I/O terminal 324 of the MUX 300.

The high band filter 304, in accordance with this representative embodiment, is an LC filter comprising a plurality of inductors 324a-324c, a plurality of capacitors 325a-225c, a load resistor 327, and a third I/O terminal 328. A first inductor 324a has a first terminal connected to the antenna 301 and a second terminal connected a first terminal of a first capacitor 325a. A second terminal of the first capacitor 325a is connected to a circuit node 329. A first terminal of a second inductor 324b is connected to circuit node 329 and a second terminal of the second inductor 324b is connected to a first terminal of a second capacitor 325b. A second terminal of the second capacitor 325b is connected to electrical ground. A first terminal of a third capacitor 325c is connected to circuit node 329 and a second terminal of the third capacitor 325c is connected to a circuit node 331.

A first terminal of a third inductor 324c is connected to circuit node 331 and a second terminal of the third inductor 324c is connected to a first terminal of a fourth capacitor 325d. A second terminal of the fourth capacitor 325d is connected to electrical ground. A first terminal of a fifth capacitor 325e is connected to circuit node 331 and a second terminal of the fifth capacitor 325e is connected to a first terminal of the load resistor 327. A second terminal of the load resistor 327 is connected to electrical ground. The first terminal of the load resistor 327 is connected to a third I/O terminal 328 of the MUX 300.

Figure 10:
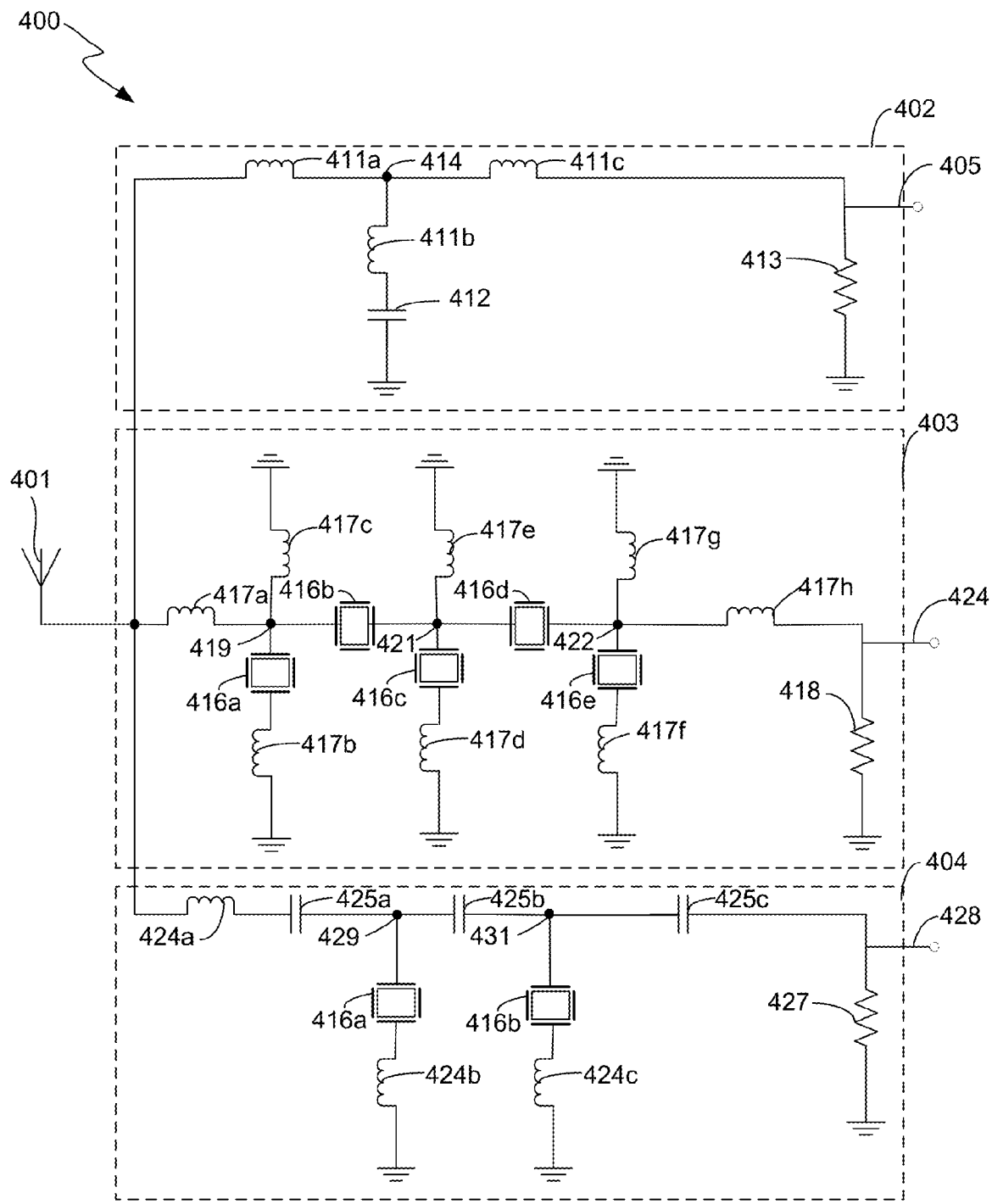
FIG. 10 illustrates a schematic diagram of the ultra-wide bandwidth MUX in accordance with another representative embodiment comprising an antenna, a low pass band LC filter, a middle pass band composite filter, and a high pass band composite filter.

FIG. 10 illustrates a schematic diagram of the ultra-wide bandwidth MUX 400 in accordance with another representative embodiment comprising an antenna 401, a low band LC filter 402, a middle band composite filter 403, and a high band composite filter 404. Each of the filters 402, 403 and 404 has an I/O terminal 405, 424 and 428, respectively.

The low band filter 402 has inductors 411a-411c, a capacitor 412 and a load resistor 413. A first inductor 411a has a first terminal connected to the antenna 401 and a second terminal connected to a circuit node 414. A second inductor 411b has a first terminal connected to circuit node 414 and a second terminal connected to a first terminal of the capacitor 412. A second terminal of the capacitor 412 is connected to electrical ground. A third inductor 411c has a first terminal connected to circuit node 414 and a second terminal connected to a first terminal of the load resistor 413. A second terminal of the load resistor 413 is connected to electrical ground. The first terminal of the load resistor 413 is connected to the first I/O terminal 405 of the MUX 400.

The middle band filter 403 comprises a plurality of acoustic resonator devices 416a-416e, a plurality of inductors 417a-417h and a load resistor 418. The shunt inductors 417c, 417e, and 417g provide the same advantages described above of extending the bandwidth of the middle band filter and of enabling it to provide dual pass bands. The acoustic resonator devices 416a-416e are typically High-Q BAW resonator devices. A first inductor 417a has a first terminal connected to the antenna 401 and a second terminal connected to a circuit node 419. A first acoustic resonator device 416a has a first terminal connected to circuit node 419 and a second terminal connected to a first terminal of a second inductor 417b. A second terminal of the second inductor 417b is connected to electrical ground. A first terminal of a third inductor 417c is connected to circuit node 419 and a second terminal of the third inductor 417c is connected to electrical ground.

A first terminal of a second acoustic resonator device 416b is connected to circuit node 419 and a second terminal of the second acoustic resonator device 416b is connected to circuit node 421. A first terminal of a third acoustic resonator device 416c is connected to node 421 and a second terminal of the third acoustic resonator device 416c is connected to a first terminal of a fourth inductor 417d. A second terminal of the fourth inductor 417d is connected to electrical ground. A first terminal of a fifth inductor 417e is connected to circuit node 421 and a second terminal of the fifth inductor 417e is connected to electrical ground.

A first terminal of a fourth acoustic resonator device 416d is connected to circuit node 421 and a second terminal of the fourth acoustic resonator device 416d is connected to circuit node 422. A first terminal of a fifth acoustic resonator device 416e is connected to circuit node 422 and a second terminal of the fifth acoustic resonator device 416e is connected to a first terminal of a sixth inductor 417f. A second terminal of the sixth inductor 417f is connected to electrical ground. A first terminal of a seventh inductor 417g is connected to circuit node 422 and a second terminal of the seventh indictor 417g is connected to electrical ground. A first terminal of a eighth inductor 417h is connected to circuit node 422 and a second terminal of the eighth indictor 417h is connected to a first terminal of a load resistor 418. A second terminal of the load resistor 418 is connected to electrical ground. The first terminal of the load resistor 418 is connected to the second I/O terminal 424 of the MUX 400.

The high band filter 404, in accordance with this representative embodiment, is a composite filter comprising a plurality of inductors 424a-424c, a plurality of capacitors 425a-425c, a plurality of acoustic resonator devices 416a and 416b, a load resistor 427, and a third I/O terminal 428. Using multiple acoustic resonator devices 416a and 416b increases the steepness of the roll-off at the edges of the high pass band compared to the high pass band provided by the high pass band filter 104 shown in FIG. 4.

A first inductor 424a has a first terminal connected to the antenna 401 and a second terminal connected a first terminal of a first capacitor 425a. A second terminal of the first capacitor 425a is connected to a circuit node 429. A first terminal of a second inductor 424b is connected to circuit node 429 and a second terminal of the second inductor 424b is connected to a first terminal of a second capacitor 425b. A second terminal of the second capacitor 425b is connected to circuit node 431. A first terminal of a third capacitor 425c is connected to circuit node 431 and a second terminal of the third capacitor 425c is connected to a first terminal of the load resistor 427.

A first terminal of a second acoustic resonator device 416b is connected to circuit node 431 and a second terminal of the second acoustic resonator device 416b is connected to a first terminal of a third inductor 424c. A second terminal of the third inductor 424c is connected to electrical ground. The first terminal of the load resistor 427 is connected to a third I/O terminal 428 of the MUX 400.

As indicated above, the acoustic resonator devices are typically high-Q BAW resonator devices such as FBAR or SMR devices. Various details of such BAW resonator devices and corresponding methods of fabrication contemplated by the present teachings, may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434, 8,188,810, and 8,230,562 to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Pat. No. 7,561,009 to Larson, et al.; U.S. Patent Application Publication No. 20120326807 to Choy, et al.; U.S. Patent Application Publication No. 20100327994 to Choy, et al.; U.S. Patent Application Publications Nos. 20110180391 and 20120177816 to Larson III, et al.; U.S. Patent Application Publication No. 20070205850 to Jamneala et al.; U.S. Patent Application Publication No. 20110266925 to Ruby, et al.; U.S. patent application Ser. No. 14/161,564 entitled: "Method of Fabricating Rare-Earth Doped Piezoelectric Material with Various Amounts of Dopants and a Selected C-Axis Orientation," filed on Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; U.S. patent application Ser. No. 13/906,873 entitled "Bulk Acoustic Wave Resonator having Piezoelectric Layer with Varying Amounts of Dopant" to John Choy, et al. and filed on May 31, 2013; and U.S. patent application Ser. No. 14/191,771, entitled "Bulk Acoustic Wave Resonator having Doped Piezoelectric Layer" to Feng, et al. and filed on Feb. 27, 2014.

The entire disclosure of each of the patents, published patent applications and patent applications listed above are hereby specifically incorporated by reference herein. It is emphasized that the components, materials and method of fabrication described in these patents and patent applications are representative and other methods of fabrication and materials within the purview of one of ordinary skill in the art are also contemplated.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A wide-bandwidth multiplexer (MUX) comprising:
an input terminal connected to an antenna;
a low band filter connected to the input terminal and having a pass band of a first frequency range, the low band filter being a first LC filter having at least a first inductor (L) and a first capacitor (C);
a middle band filter connected to the input terminal and having a pass band of a second frequency range that is higher than the first frequency range, the middle band filter being a composite filter having at least a first acoustic resonator device and a second inductor that are connected in series with one another and in parallel with a third inductor, wherein the connection of the first acoustic resonator device and the second inductor in series with one another and in parallel with the third inductor extends the pass band of the middle band filter; and
a high band filter connected to the input terminal and having a pass band of a third frequency range that is higher than the second frequency range, the high band filter being one of a second LC filter having at least a fourth inductor and a second capacitor and a composite filter having at least a fifth inductor, a third capacitor and a second acoustic resonator device.

2. The wide-bandwidth MUX of claim 1, wherein the MUX is an ultra-wide-bandwidth MUX, wherein the first frequency range has a lowest frequency that is more than 8% below a center frequency of the second frequency range, and wherein the third frequency range has a highest frequency that is more than 8% above the center frequency of the second frequency range.

3. The wide-bandwidth MUX of claim 2, wherein the first frequency range is between approximately 700 megahertz (MHz) and approximately 960 MHz, and wherein the second frequency range is between approximately 1710 MHz and approximately 2170 MHz, and wherein the third frequency range is between approximately 2300 MHz and approximately 2690 MHz.

4. The wide-bandwidth MUX of claim 3, wherein the pass band of the middle band filter is a dual pass band that further includes a fourth frequency range ranging from approximately 1427.9 MHz to approximately 1511 MHz.

5. The wide-bandwidth MUX of claim 3, wherein at least one of the first and second acoustic resonator devices comprises one of a bulk acoustic wave (BAW) resonator device and a surface acoustic wave (SAW) resonator device.

6. The wide-bandwidth MUX of claim 5, wherein at least one of the first and second acoustic resonator devices comprises at least one of a thin film bulk acoustic resonator (FBAR) device and a solidly mounted resonator (SMR) device.

7. The wide-bandwidth MUX of claim 1, wherein the first LC filter comprises at least a first LC circuit branch, the first LC circuit branch including at least the first inductor and the first capacitor connected in series, a first end of the first LC circuit branch being connected to a first circuit node of the low band filter, a second end of the first LC circuit branch being connected to electrical ground.

8. The wide-bandwidth MUX of claim 7, wherein the first LC filter further comprises at least a sixth inductor having a first terminal connected to the input terminal and a second terminal connected to the first circuit node.

9. The wide-bandwidth MUX of claim 8, wherein the first LC filter further comprises at least a seventh inductor having a first terminal connected to the first circuit node and a second terminal connected to a first output terminal of the MUX.

10. The wide-bandwidth MUX of claim 8, wherein the first LC filter further comprises at least a seventh inductor having a first terminal connected to the first circuit node and a second terminal connected to a second circuit node.

11. The wide-bandwidth MUX of claim 10, wherein the first LC filter further comprises at least a second circuit branch having at least an eighth inductor and a fourth capacitor, the eighth inductor having a first terminal connected to the second circuit node and a second terminal to a first terminal of the fourth capacitor, the fourth capacitor having a second terminal that is connected to electrical ground.

12. The wide-bandwidth MUX of claim 1, wherein the middle band filter further includes a third acoustic resonator device.

13. The wide-bandwidth MUX of claim 1, wherein the high band filter is the composite filter, and wherein the composite filter further includes at least a sixth inductor.

14. The wide-bandwidth MUX of claim 1, wherein the middle band filter further includes at least a sixth inductor and a third acoustic resonator device, the sixth inductor having a first terminal that is connected to the input terminal of the MUX and a second terminal that is connected to a first circuit node of the middle band filter, the first acoustic resonator device having a first terminal that is connected to the first circuit node of the middle band filter and a second terminal that is connected to a first terminal of the second inductor, a second terminal of the second inductor being connected to electrical ground, the third acoustic resonator device having a first terminal that is connected to the first circuit node of the middle band filter and a second terminal that is connected to a second circuit node of the middle band filter, the third inductor having a first terminal that is connected to the first circuit node of the middle band filter and having a second terminal that is connected to electrical ground.

15. The wide-bandwidth MUX of claim 14, wherein the high band filter is the second LC filter, and wherein the second LC filter further includes a seventh inductor.

16. The wide-bandwidth MUX of claim 15, wherein the high band filter is the composite filter, and wherein the composite filter further includes a fourth acoustic resonator device, and wherein the fourth acoustic resonator device improves a steepness of the high band filter.

17. The wide-bandwidth MUX of claim 16, wherein the composite filter further includes at least a seventh inductor and a fourth capacitor, wherein the fifth inductor has a first terminal that is connected to the input terminal of the MUX and a second terminal that is connected to a first terminal of the third capacitor, a second terminal of the third capacitor being connected to a first circuit node of the composite filter, a first terminal of the seventh inductor being connected to the first circuit node of the composite filter and a second terminal of the seventh inductor being connected to electrical ground, a first terminal of the fourth capacitor being connected to the first circuit node of the composite filter and a second terminal of the fourth capacitor being connected to electrical ground.

18. The wide-bandwidth MUX of claim 17, wherein the composite filter further includes a fifth capacitor and an eighth inductor, wherein a first terminal of the eighth inductor is connected to the first circuit node of the composite filter and a second terminal of the eighth inductor is connected to a first terminal of the fifth capacitor, a second terminal of the fifth capacitor being connected to a second circuit node of the composite filter, a first terminal of the fourth acoustic resonator device being connected to the second circuit node of the high band filter.

19. The wide-bandwidth MUX of claim 17, wherein the composite filter further includes a fifth capacitor and an eighth inductor, wherein a first terminal of the fifth capacitor is connected to the first circuit node of the composite filter and a second terminal of the fifth capacitor is connected to a first terminal of the eighth inductor, a second terminal of the eighth inductor being connected to a second circuit node of the composite filter, a first terminal of the fourth acoustic resonator device being connected to the second circuit node of the composite filter.

20. The wide-bandwidth MUX of claim 16, wherein the high band filter is the composite filter, and wherein the composite filter further includes at least a fifth acoustic resonator device, a seventh inductor, an eighth inductor and a fourth capacitor, the fifth inductor having a first terminal that is connected to the input terminal of the MUX and a second terminal that is connected to a first terminal of the third capacitor, the third capacitor having a second terminal that is connected to a first circuit node of the composite filter, the fourth acoustic resonator device having a first terminal that is connected to the first circuit node of the composite filter and a second terminal that is connected to a first terminal of the seventh inductor, the second terminal of the seventh inductor being connected to electrical ground, a first terminal of the fourth capacitor being connected to the first circuit node of the high band filter, the second terminal of the fourth capacitor being connected to a second circuit node of the composite filter, a first terminal of the fifth acoustic resonator device being connected to the second circuit node of the composite filter, a second terminal of the fifth acoustic resonator device being connected to a first terminal of the eighth inductor, a second terminal of the eighth inductor being connected to electrical ground.

21. The wide-bandwidth MUX of claim 14, wherein the middle band filter further includes at least seventh and eighth inductors connected in parallel to one another and in parallel with the third inductor, the seventh inductor having a first terminal that is connected to the second circuit node of the middle band filter and a second terminal that is connected to electrical ground, the eighth inductor having a first terminal that is connected to a third circuit node of the middle band filter and a second terminal that is connected to electrical ground.

22. The wide-bandwidth MUX of claim 1, wherein the low band filter is one of a lowpass filter and a bandpass filter.

23. The wide-bandwidth MUX of claim 1, wherein the high band filter is one of a highpass filter and a bandpass filter.

24. An ultra-wide-bandwidth multiplexer (MUX) for performing carrier aggregation (CA) of signals having frequencies that are within one of a first, second and third frequency range, wherein the first frequency range has a lowest frequency that is more than 8% below a center frequency of the second frequency range, and wherein the third frequency range has a highest frequency that is more than 8% above the center frequency of the second frequency range, the MUX comprising:
  an input terminal connected to an antenna;
  a low band filter connected to the input terminal and having a pass band in the first frequency range, the low band filter being a first LC filter having at least a first inductor (L) and first capacitor (C);
  a middle band filter connected to the input terminal and having a pass band in the second frequency range that is higher than the first frequency range, the middle band filter being a composite filter having at least first and second acoustic resonator devices, a second inductor and a third inductor, the first acoustic resonator device and the second inductor being connected in series with one another and in parallel with the third inductor, wherein the connection of the first acoustic resonator device and the third inductor in series with one another and in parallel with the third inductor extends the pass band of the middle band filter; and
  a high band filter connected to the input terminal and having a pass band in the third frequency range that is higher than the second frequency range, the high band filter being a composite filter having at least second and third capacitors, a third acoustic resonator device and fourth and fifth inductors.

25. The ultra-wide-bandwidth MUX of claim 24, wherein the middle band filter further includes a sixth inductor, the sixth inductor having a first terminal that is connected to the input terminal of the MUX and a second terminal that is connected to a first circuit node of the middle band filter, the first acoustic resonator device having a first terminal that is connected to the first circuit node of the middle band filter and a second terminal that is connected to a first terminal of the third inductor, a second terminal of the third inductor being connected to electrical ground, the second acoustic resonator device having a first terminal that is connected to the first circuit node of the middle band filter and a second terminal that is connected to a second circuit node of the middle band filter.

26. The ultra-wide-bandwidth MUX of claim 25, wherein the fourth inductor has a first terminal that is connected to the input terminal of the MUX and a second terminal that is connected to a first terminal of the second capacitor, the second capacitor having a second terminal that is connected to a first circuit node of the high band filter, the third acoustic resonator device having a first terminal that is connected to the first circuit node of the high band filter.

27. The ultra-wide-bandwidth MUX of claim 25, wherein the fourth inductor has a first terminal that is connected to the input terminal of the MUX and a second terminal that is connected to a first terminal of the second capacitor, the second capacitor having a second terminal that is connected to a first circuit node of the high band filter, wherein the fifth inductor has a first terminal that is connected to the first circuit node of the high band filter and a second terminal that is connected to a first terminal of the third capacitor, the third capacitor having a second terminal that is connected to a second circuit node of the high band filter, the third acoustic resonator device having a first terminal that is connected to the second circuit node of the high band filter.

28. The ultra-wide-bandwidth MUX of claim 25, wherein the middle band filter further includes at least seventh and eighth inductors connected in parallel to one another and in parallel with the third inductor, the third inductor having a first terminal that is connected to the first circuit node of the middle band filter and a second terminal that is connected to electrical ground, the seventh inductor having a first terminal that is connected to the second circuit node of the middle band filter and a second terminal that is connected to electrical ground, the eighth inductor having a first terminal that is connected to a third circuit node of the middle band filter and a second terminal that is connected to electrical ground.

29. A wide-bandwidth multiplexer (MUX) comprising:
an input terminal connected to an antenna;
a low band filter connected to the input terminal and having a pass band of a first frequency range that ranges from approximately 700 megahertz (MHz) to approximately 960 MHz, the low band filter being an LC filter having at least a first inductor (L) and a first capacitor (C);
a middle band filter connected to the input terminal and having a pass band of a second frequency range that is higher than the first frequency range, wherein the second frequency range is a dual frequency range that includes frequencies ranging from approximately 1710 MHz to approximately 2170 MHz and frequencies ranging from approximately 1427.9 MHz to approximately 1511 MHz, the middle band filter being a composite filter having at least a first acoustic resonator device and a second inductor that are connected in series with one another and in parallel with a third inductor of the composite filter, wherein the connection of the first acoustic resonator device and the second inductor in series with one another and in parallel with the third inductor extends the pass band of the middle band filter; and
a high band filter connected to the input terminal and having a pass band of a third frequency range that is higher than the second frequency, wherein the third frequency range is between approximately 2300 MHz and approximately 2690 MHz, the high band filter being one of a second LC filter having at least a fourth inductor and a second capacitor and a composite filter having at least a fifth inductor, a third capacitor and a second acoustic resonator device.

* * * * *